United States Patent
Tan et al.

(10) Patent No.: US 10,103,056 B2
(45) Date of Patent: Oct. 16, 2018

(54) METHODS FOR WET METAL SEED DEPOSITION FOR BOTTOM UP GAPFILL OF FEATURES

(71) Applicant: Lam Research Corporation, Fremont, CA (US)

(72) Inventors: Samantha Tan, Fremont, CA (US); Boris Volosskiy, San Jose, CA (US); Taeseung Kim, Fremont, CA (US); Praveen Nalla, Fremont, CA (US); Novy Tjokro, Fremont, CA (US); Artur Kolics, Dublin, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/453,098

(22) Filed: Mar. 8, 2017

(65) Prior Publication Data

US 2018/0261502 A1 Sep. 13, 2018

(51) Int. Cl.
*H01L 21/768* (2006.01)

(52) U.S. Cl.
CPC .. *H01L 21/76874* (2013.01); *H01L 21/76864* (2013.01); *H01L 21/76867* (2013.01)

(58) Field of Classification Search
CPC ......... H01L 21/76874; H01L 21/76864; C23C 16/0209; C23C 18/1641
See application file for complete search history.

(56) References Cited

U.S. PATENT DOCUMENTS

| | | | |
|---|---|---|---|
| 5,674,787 A | 10/1997 | Zhao et al. | |
| 6,913,851 B2 | 7/2005 | Ivanov et al. | |
| 7,446,034 B2 | 11/2008 | Shih et al. | |
| 8,906,446 B2 | 12/2014 | Ivanov et al. | |
| 9,287,183 B1 | 3/2016 | Zhao et al. | |
| 2006/0240187 A1* | 10/2006 | Weidman | C23C 16/0272 427/248.1 |
| 2007/0099422 A1* | 5/2007 | Wijekoon | C23C 18/165 438/687 |
| 2010/0171780 A1* | 7/2010 | Madigan | B41J 2/14 347/12 |

(Continued)

OTHER PUBLICATIONS

Cairns, J.A., et al. "UV-induced decomposition and interrogation of novel metal-precursor films" Lasers for Science Facility Programme; Central Laser Facility Annual Report; 2005/2006; pp. 175-176.

(Continued)

*Primary Examiner* — Marcos D Pizarro
*Assistant Examiner* — Antonio Crite

(57) ABSTRACT

A method of depositing a metal seed for performing bottom-up gapfill of features of a substrate includes providing a substrate including a plurality of features; flowing a dilute metal precursor solution into the features, wherein the dilute metal precursor solution includes a metal precursor and a dilution liquid; evaporating the dilution liquid to locate the metal precursor at bottoms of the plurality of features; exposing the substrate to a plasma treatment to reduce the metal precursor to at least one of a metal or a metal alloy and to form a seed layer; performing a heat treatment on the substrate; and using a selective gapfill process to fill the features with a transition metal in contact with the seed layer.

27 Claims, 3 Drawing Sheets

(56) References Cited

U.S. PATENT DOCUMENTS

2014/0124361 A1* 5/2014 Reid ................. C25D 17/008
  204/227
2016/0194759 A1* 7/2016 Kim ................. C23C 18/1608
  174/250
2017/0213762 A1* 7/2017 Gouk ............ H01L 21/76873

OTHER PUBLICATIONS

Forsman, J., et al. "Production of cobalt and nickel particles by hydrogen reduction"; Research Paper: J Nanopart Res. (2008); Springer; pp. 745-759.

Inoue, Fumihiro, et al. "Formation of electroless barrier and seed layers in a high aspect ratio through-Si vias using Au nanoparticle catalyst for all-wet Cu filling technology;" Electrochimica Acta 56 (2011); pp. 6245-6250.

* cited by examiner

METHODS FOR WET METAL SEED DEPOSITION FOR BOTTOM UP GAPFILL OF FEATURES

FIELD

The present disclosure relates to substrate processing methods, and more particularly to substrate processing methods including wet metal seed deposition at bottoms of features of a substrate followed by bottom up gapfill of the features.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrates such as semiconductor wafers are produced by depositing, etching and patterning film layers. Deposition processes include physical vapor deposition (PVD), chemical vapor deposition (CVD) and atomic layer deposition (ALD). In some circumstances, a seed layer is deposited at bottoms of features such as trenches or vias. However, none of these deposition processes is able to selectively deposit material on bottom surfaces of trenches or vias. These deposition processes can only perform conformal or non-selective seed deposition. Other disadvantages of these deposition processes include pinch-off at openings of the features and seams/roughness resulting from sidewall growth.

SUMMARY

A method of depositing a metal seed for performing bottom-up gapfill of features of a substrate includes providing a substrate including a plurality of features; flowing a dilute metal precursor solution into the features. The dilute metal precursor solution includes a metal precursor and a dilution liquid. The method includes evaporating the dilution liquid to locate the metal precursor at bottoms of the plurality of features; exposing the substrate to a plasma treatment to reduce the metal precursor to at least one of a metal or a metal alloy and to form a seed layer; performing a heat treatment on the substrate; and using a selective gapfill process to fill the features with a transition metal in contact with the seed layer.

In other features, the substrate includes a liner layer and the dilute metal precursor solution is applied to the liner layer. The liner layer is made of a material selected from a group consisting of titanium nitride (TiN), tungsten carbonitride (WCN), and tantalum nitride (TaN). The liner layer is made of a material selected from a group consisting of silicon dioxide, a metal, or a dielectric.

In other features, the transition metal is selected from a group consisting of nickel (Ni), cobalt (Co), copper (Cu), molybdenum (Mo), ruthenium (Ru), iridium (Ir), platinum (Pt), palladium (Pd) and tungsten (W). The at least one of the metal or the metal alloy is selected to catalytically react with the transition metal but not the liner layer. The selective gapfill process includes electroless deposition.

In other features, the dilution liquid comprises at least one of a carrier liquid and a solvent. The dilution liquid is water-free. The dilution liquid comprises a liquid selected from a group consisting of alcohol, ether, ester, perflouroether. The dilution liquid comprises a liquid selected from a group consisting isopropyl alcohol (IPA) and ethyl alcohol (EtOH).

In other features, the features have openings having a width that is less than or equal to 10 nm. The features have openings having a width in a range from 7 to 9 nm. The features have openings having a width in a range from 4 to 7 nm. The seed layer has a thickness in a range from 2-4 nm. The heat treatment comprises annealing at a temperature in a range from 200° C. to 400° C. The heat treatment comprises annealing at a temperature in a range from 250° C. to 350° C.

In other features, evaporating the dilution liquid includes exposing the substrate to a gradient dry process. The dilute metal precursor solution is at least one of deposited or condensed in the plurality of features using by capillary action.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
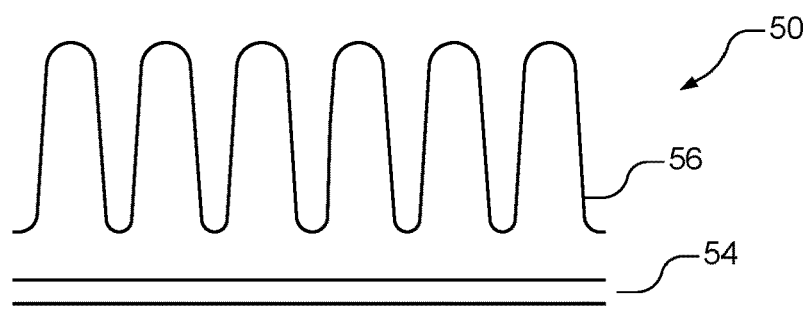
FIG. 1 is a side cross-sectional view of an example of a substrate including features such as trenches or vias according to the present disclosure.

Deposition methods described herein are used to deposit a metal seed layer at bottoms of features such as trenches or vias for subsequent selective metal gapfill. In some examples, the substrate includes a liner or barrier layer. As used herein, the term selective gapfill refers to deposition of metal on some exposed materials (such as on a metal seed layer) and not on other exposed layers (such as a liner layer or feature sidewalls). In some examples, the metal seed layer has a thickness in a range from of 2-4 nm localized at the bottoms of the features. In some examples, the metal seed layer is used to grow the transition metal by electroless deposition (ELD) or other selective gapfill processes can be used.

The method includes condensing or flowing a dilute metal precursor solution over the substrate to fill the features. In some examples, the features are filled by capillary action of liquids. The dilute metal precursor solution includes a metal precursor and a liquid carrier or solvent. Once the metal precursor solution is located in the features, the solvent or carrier liquid is removed by evaporation to allow the metal precursor to concentrate and deposit only at the bottoms of the features.

The substrate is exposed to plasma treatment in a plasma chamber to reduce the metal precursor to a metal or metal alloy and to form a seed layer. A heat treatment step may be used to improve precursor adhesion to an underlying barrier layer. In some examples, the heat treatment step includes annealing the substrate at a temperature in a range between 200° C. and 400° C. In some examples, the heat treatment step includes annealing the substrate at a temperature in a range between 250° C. and 350° C. In some examples, the heat treatment step is performed in a reducing atmosphere including a reducing gas mixture. In some examples, the reducing gas mixture includes molecular hydrogen ($H_2$), molecular hydrogen and molecular nitrogen ($H_2/N_2$), or molecular hydrogen and ammonia ($H_2/NH_3$) to convert the metal precursor to the metallic form.

In some examples, the substrate with the activated metal/metal alloy seed layer located at the bottom of the features is transported to an electroless deposition (ELD) tool for a selective deposition process to achieve bottom-up gapfill in the features. The ELD process is selective since only the reduced precursor at the bottoms of the features is catalytically active for the plating process. In some examples, selective bottom-up fill can be performed using electrochemical plating (ECP), chemical vapor deposition (CVD) or other process.

The deposition method according to the present disclosure can be used for transition metals such as nickel (Ni), cobalt (Co), copper (Cu), molybdenum (Mo), ruthenium (Ru), iridium (Ir), platinum (Pt), palladium (Pd) and tungsten (W). In some examples, the deposition method is used for metal gapfill in contact holes and middle of line (MOL) and BEOL trenches/vias. In some examples, the liner layer includes titanium/titanium nitride (TiN), tungsten carbonitride (WCN), or tantalum/tantalum nitride (TaN). Alternately, the deposition process can be used with oxide sidewalls or with any other metal or dielectric barrier materials.

The solvent or carrier liquid that is selected will depend on the metal precursor that is used. In some examples, the solvent or carrier liquid for the metal precursor is water-free to minimize formation of metal oxide during the subsequent processing. In some examples, the solvent or carrier liquid has low surface tension and high solubility for the metal precursors, such as alcohols (e.g. isopropyl alcohol (IPA), ethyl alcohol (EtOH)), ethers, esters, perflouro-ethers, etc.

In some examples, the metal precursor comprises a stable salt (inorganic or organometallic) at room temperature. In some examples, the metal precursor does not decompose or sublime when exposed to ambient temperatures and pressures. In some examples, the metal precursor is soluble in low boiling point organic solvents (<80° C. to 90° C.). In some examples, the solvents have a low boiling point (e.g. less than 100° C.), low surface tension to enable capillary filling of narrow trenches and holes (e.g. less than 10 nm in width, in a range from 7-9 nm or in a range from 4-7 nm, etc.) and no water or low water content. In some examples, a concentration of salt in the solvent does not exceed a solubility constant (Ksp) of salt in the final 10-20% of volume in the trench to prevent early precipitation onto sidewalls.

In some examples, a gradient drying process is used to concentrate the organometallic or salt at bottoms of the features without leaving metallic deposits on the sidewalls. As used herein, the gradient dry process includes ramping or increasing temperature at one or more predetermined rates over a predetermined period. In some examples, a reduction process that is used to convert organometallic or salt to metal does not damage a liner/barrier/substrate material.

Figure 2:
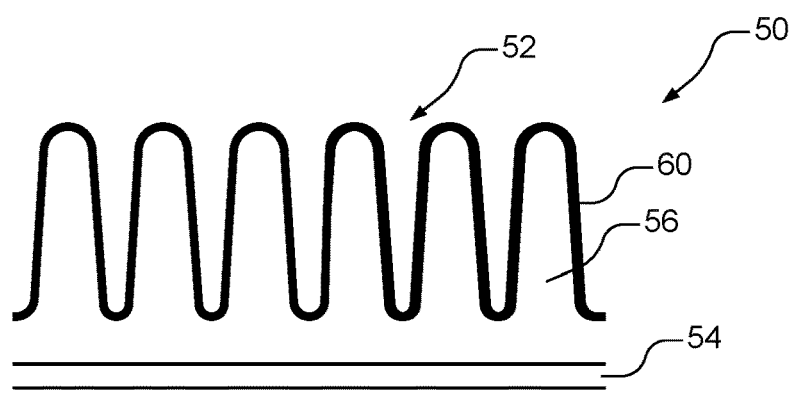
FIG. 2 is a side cross-sectional view of an example of the substrate of FIG. 1 with a liner layer according to the present disclosure.
Figure 3:
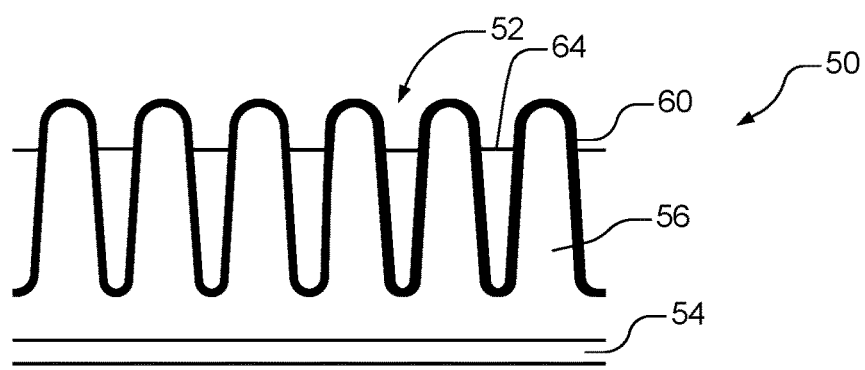
FIG. 3 is a side cross-sectional view of an example of the substrate of FIG. 2 and a dilute metal precursor solution at least partially filling the features according to the present disclosure.

Referring now to FIGS. 1-3, processing of a substrate 50 is shown. In FIG. 1, the substrate 50 is shown to include features 52 such as trenches or vias. The features 52 are defined in a layer 56 that is arranged on one or more underlying layers 54. In some examples, the layer 56 may be made of silicon dioxide ($SiO_2$) or another suitable film material. In some examples, the features 52 have a width that is less than or equal to 10 nm.

In FIG. 2, a liner layer 60 is deposited on the layer 56. The liner layer 60 may be deposited on the layer 56 using any suitable approach including chemical vapor deposition (CVD), atomic layer deposition (ALD), plasma enhanced CVD (PECVD), plasma enhanced ALD (PEALD), or any other suitable process.

In FIG. 3, a dilute metal precursor solution 64 is used to fill the features 52. In some examples, the dilute metal precursor solution 64 includes a metal precursor that is mixed with a solvent or carrier liquid. In some examples, the metal precursor includes a metal precursor that is used to form a transition metal. In some examples, the dilute metal precursor solution 64 fills the features 52 by capillary action.

Figure 4:
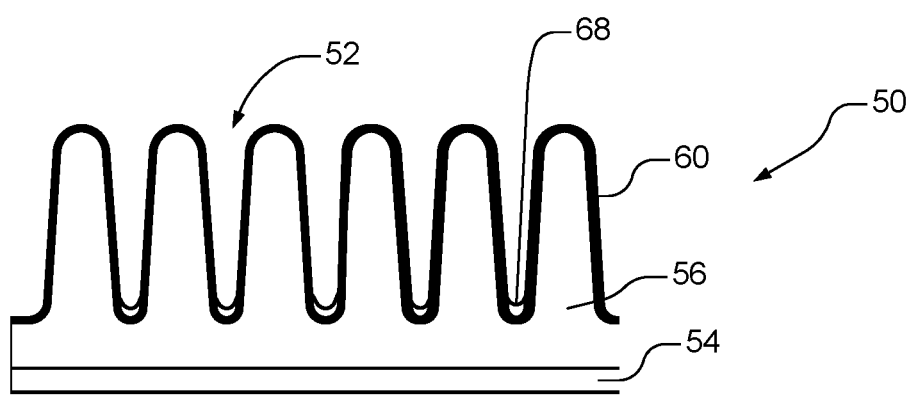
FIG. 4 is a side cross-sectional view of an example of the substrate of FIG. 3 after drying according to the present disclosure.
Figure 5:
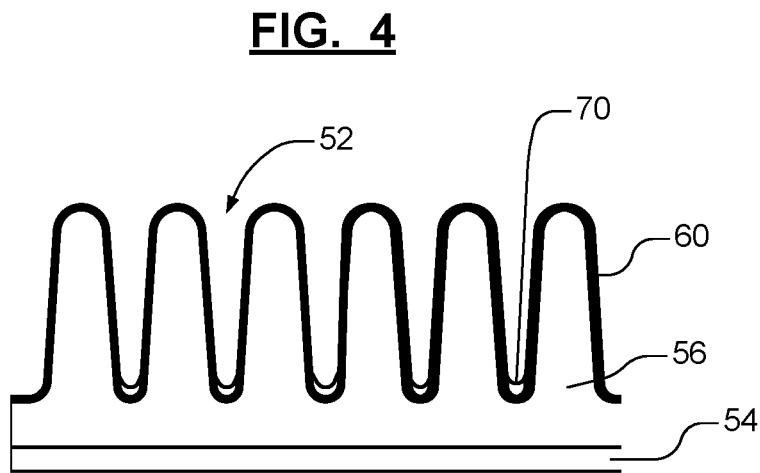
FIG. 5 is a side cross-sectional view of an example of the substrate of FIG. 3 after exposure to plasma according to the present disclosure.
Figure 6:
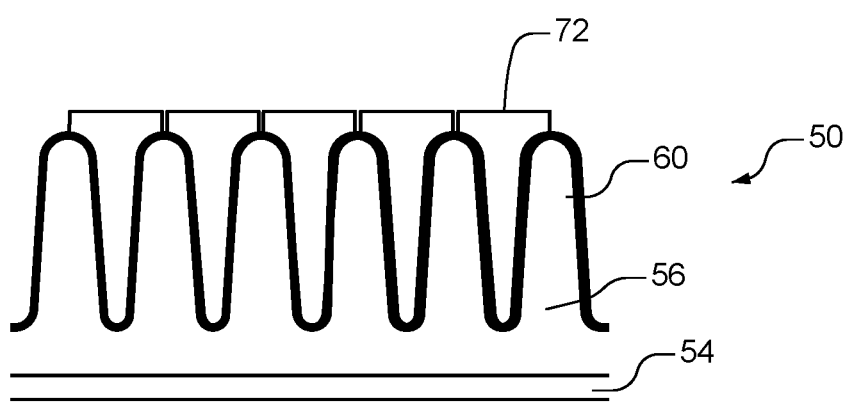
FIG. 6 is a side cross-sectional view of an example of the substrate of FIG. 3 after bottom-up, selective gapfill of features according to the present disclosure.

Referring now to FIGS. 4-6, additional processing of the substrate 50 is performed. In FIG. 4, the substrate 50 is subjected to heat or another process such as vacuum to evaporate the solvent or carrier liquid from the dilute metal precursor solution 64. In some examples, a gradient dry process is used. The gradient dry process involves slowly ramping up a temperature of the substrate to cause evaporation of the dilution liquid and to slowly lower a meniscus and reduce metal buildup on sidewalls of the features. For example, with an isopropyl alcohol (IPA) carrier, the temperature is slowly ramped up from room temperature to 60° C. at a rate of 1-2° C./min to concentrate the metal precursor at the bottom of the feature.

After evaporation is complete, the metal precursor 68 remains at a bottom of the features. In FIG. 5, the substrate 50 is subjected to a reducing plasma process to reduce the metal precursor 68 to a metal or metal alloy and form a seed layer 70. In some examples, the reducing plasma process uses molecular hydrogen gas. In some examples, the plasma process includes a capacitively coupled plasma (CCP) process or an inductively coupled plasma (ICP) process. In another example, the reduction process can moved to an annealing chamber with $H_2/N_2$ or $NH_3/H_2$ at 200° C. to 400° C. for a predetermined period. In some examples, the predetermined period is in a range from 2-20 minutes to completely convert the metal precursor to metallic form.

In some examples, the seed layer has a thickness in a range from 2 to 4 nm. In FIG. 6, electroless deposition (ELD) or another selective gapfill process is performed to fill the features with a transition metal 72.

Figure 7:
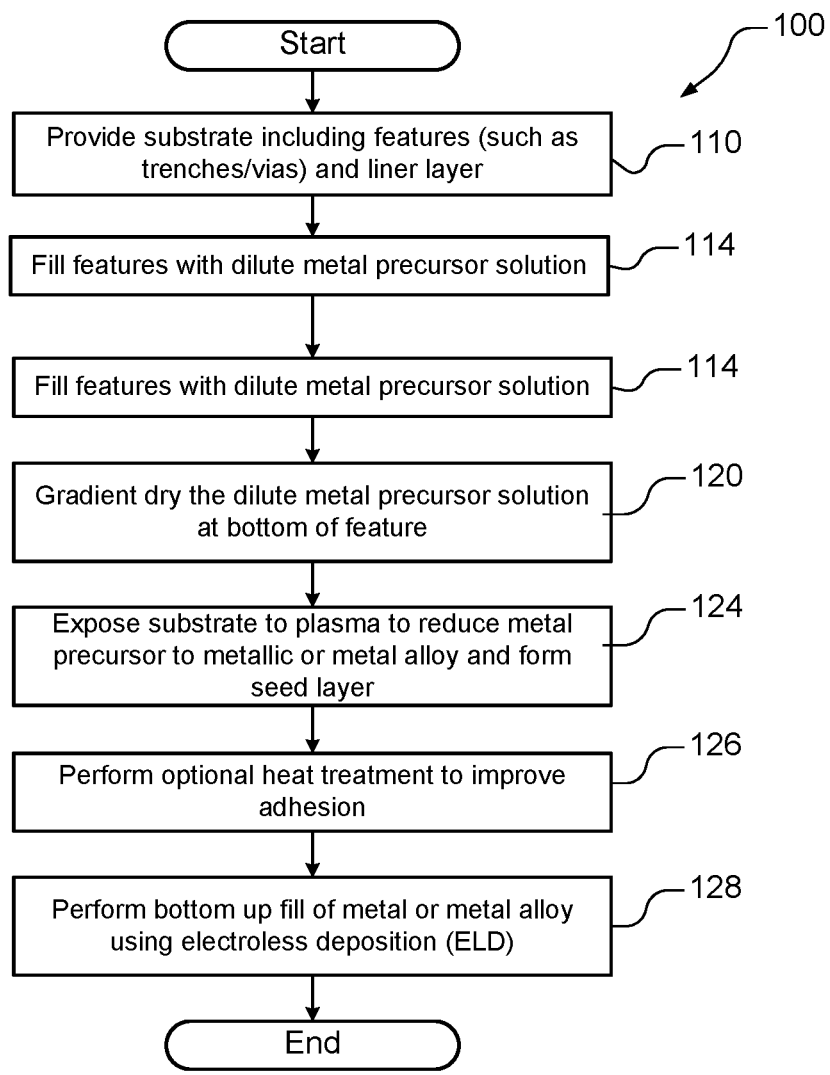
FIG. 7 is an example of an example of a flowchart for bottom up gapfill of features according to the present disclosure.

Referring now to FIG. 7, a method 100 for forming a seed layer and bottom-up selective gapfill of features with a transition metal is shown. At 110, a substrate is provided that includes features such as trenches or vias. In some examples, the substrate includes a liner layer. At 114, the features of the substrate are filled with a dilute metal precursor solution.

At 120, the carrier liquid or solvent is evaporated. In some examples, a gradient dry process is used. At 124, the substrate is exposed to plasma to reduce the metal precursor to a metal or metal alloy and form a seed layer. At 126, an optional heat treatment such as annealing may be performed to improve adhesion.

At 128, selective bottom-up gapfill of the features is performed using electroless deposition (ELD) or another selective gapfill process is used. In some examples, an electroless deposition method described in U.S. Pat. No. 9,287,183 is used to fill the features, although other electroless deposition methods may be used. In some examples, an electroless deposition tool shown and described in U.S. Pat. No. 8,906,446 or U.S. Pat. No. 6,913,651 is used, although other electroless deposition tools may be used.

In one example, features such as trenches are defined in a silicon dioxide ($SiO_2$) layer. A tungsten carbonitride (WCN) liner layer is deposited. A cobalt salt precursor such as cobalt (II) chloride ($CoCl_2$) is diluted in isopropyl alcohol (IPA) and applied in the features by capillary action. The substrate is gradient dried from top surfaces thereof such that the IPA evaporates and the cobalt salt precursor condenses at bottoms of the features. The substrate is exposed to a plasma process using plasma gas including molecular hydrogen ($H_2$). The plasma reduces the cobalt salt precursor to cobalt metal and forms a seed layer in the following reaction:

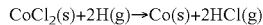

$$CoCl_2(s)+2H(g) \rightarrow Co(s)+2HCl(g)$$

Then, cobalt metal is deposited in the features using a bottom-up electroless fill process.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

What is claimed is:
1. A method of depositing a metal seed for performing bottom-up gapfill of features of a substrate, comprising:
providing a substrate including a plurality of features;
flowing a dilute metal precursor solution into the features, wherein the dilute metal precursor solution includes a metal precursor and a dilution liquid;
evaporating the dilution liquid to locate the metal precursor at bottoms of the plurality of features, wherein evaporating the dilution liquid includes exposing the substrate to a gradient dry process;
exposing the substrate to a plasma treatment to reduce the metal precursor to at least one of a metal or a metal alloy and to form a seed layer only at the bottoms of the plurality of features;
performing a heat treatment on the substrate; and
using a selective gapfill process to fill the features with a transition metal in contact with the seed layer and not other exposed portions of the plurality of features.

2. The method of claim 1, wherein the substrate includes a liner layer and the dilute metal precursor solution is applied to the liner layer.

3. The method of claim 1, wherein the transition metal is selected from a group consisting of nickel (Ni), cobalt (Co), copper (Cu), molybdenum (Mo), ruthenium (Ru), iridium (Ir), platinum (Pt), palladium (Pd) and tungsten (W).

4. The method of claim 1, wherein the selective gapfill process includes electroless deposition.

5. The method of claim 1, wherein the dilution liquid comprises at least one of a carrier liquid and a solvent.

6. The method of claim 1, wherein the dilution liquid is water-free.

7. The method of claim 1, wherein the dilution liquid comprises a liquid selected from a group consisting of alcohol, ether, ester, perflouro-ether.

8. The method of claim 1, wherein the dilution liquid comprises a liquid selected from a group consisting isopropyl alcohol (IPA) and ethyl alcohol (EtOH).

9. The method of claim 1, wherein the dilute metal precursor solution is at least one of deposited or condensed in the plurality of features using by capillary action.

10. A method of depositing a metal seed for performing bottom-up gapfill of features of a substrate, comprising:
providing a substrate including a plurality of features;
flowing a dilute metal precursor solution into the features, wherein the dilute metal precursor solution includes a metal precursor and a dilution liquid;
evaporating the dilution liquid to locate the metal precursor at bottoms of the plurality of features;
exposing the substrate to a plasma treatment to reduce the metal precursor to at least one of a metal or a metal alloy and to form a seed layer;
performing a heat treatment on the substrate; and
using a selective gapfill process to fill the features with a transition metal in contact with the seed layer,
wherein evaporating the dilution liquid includes exposing the substrate to a gradient dry process.

11. The method of claim 10, wherein the features have openings having a width that is less than or equal to 10 nm.

12. The method of claim 10, wherein the features have openings having a width in a range from 7 to 9 nm.

13. The method of claim 10, wherein the features have openings having a width in a range from 4 to 7 nm.

14. The method of claim 10, wherein the seed layer has a thickness in a range from 2-4 nm.

15. The method of claim 10, wherein the heat treatment comprises annealing at a temperature in a range from 200° C. to 400° C.

16. The method of claim 10, wherein the heat treatment comprises annealing at a temperature in a range from 250° C. to 350° C.

17. The method of claim 10, wherein the transition metal is selected from a group consisting of nickel (Ni), cobalt (Co), copper (Cu), molybdenum (Mo), ruthenium (Ru), iridium (Ir), platinum (Pt), palladium (Pd) and tungsten (W).

18. The method of claim 10, wherein the selective gapfill process includes electroless deposition.

19. The method of claim 10, wherein the dilution liquid comprises at least one of a carrier liquid and a solvent.

20. The method of claim 10, wherein the dilution liquid is water-free.

21. The method of claim 10, wherein the dilution liquid comprises a liquid selected from a group consisting of alcohol, ether, ester, perflouro-ether.

22. The method of claim 10, wherein the dilution liquid comprises a liquid selected from a group consisting isopropyl alcohol (IPA) and ethyl alcohol (EtOH).

23. The method of claim 10, wherein the dilute metal precursor solution is at least one of deposited or condensed in the plurality of features using by capillary action.

24. The method of claim 10, wherein the substrate includes a liner layer and the dilute metal precursor solution is applied to the liner layer.

25. The method of claim 24, wherein the liner layer is made of a material selected from a group consisting of titanium nitride (TiN), tungsten carbonitride (WCN), and tantalum nitride (TaN).

26. The method of claim 24, wherein the liner layer is made of a material selected from a group consisting of silicon dioxide, a metal, or a dielectric.

27. The method of claim 24, wherein the at least one of the metal or the metal alloy is selected to catalytically react with the transition metal but not the liner layer.

* * * * *